(12) United States Patent
Archibald et al.

(10) Patent No.: US 8,947,880 B2
(45) Date of Patent: Feb. 3, 2015

(54) HOT OR COLD AISLE COMPUTER CHASSIS

(75) Inventors: Matthew R. Archibald, Morrisville, NC (US); Jerrod K. Buterbaugh, Wake Forest, NC (US)

(73) Assignee: Lenovo Enterprise Solutions (Singapore) Ptd. Ltd., Singapore (SG)

( * ) Notice: Subject to any disclaimer, the term of this patent is extended or adjusted under 35 U.S.C. 154(b) by 259 days.

(21) Appl. No.: 13/479,708

(22) Filed: May 24, 2012

(65) Prior Publication Data

US 2013/0200764 A1  Aug. 8, 2013

Related U.S. Application Data

(63) Continuation of application No. 12/851,992, filed on Aug. 6, 2010, now Pat. No. 8,270,161.

(51) Int. Cl.
H05K 7/20 (2006.01)
H05K 5/02 (2006.01)
G06F 1/20 (2006.01)

(52) U.S. Cl.
CPC ........... *H05K 5/0213* (2013.01); *G06F 1/20* (2013.01); *H05K 7/20736* (2013.01); *H05K 7/20745* (2013.01)
USPC ...... 361/703; 361/679.46; 361/688; 361/689; 361/690

(58) Field of Classification Search
None
See application file for complete search history.

(56) References Cited

U.S. PATENT DOCUMENTS

| | | | |
|---|---|---|---|
| 3,065,686 A | 11/1962 | Geocaris | |
| 3,318,225 A | 5/1967 | May | |
| 4,158,875 A | 6/1979 | Tajima et al. | |
| 4,335,647 A | 6/1982 | Timmons | |
| 4,531,454 A | 7/1985 | Spoormaker | |
| 4,775,001 A | 10/1988 | Ward et al. | |
| 5,216,579 A | 6/1993 | Basara et al. | |
| 5,345,779 A | 9/1994 | Feeney | |
| 5,467,609 A | 11/1995 | Feeney | |
| 5,769,702 A | 6/1998 | Hanson | |
| 5,995,368 A | 11/1999 | Lee et al. | |
| 6,183,359 B1 | 2/2001 | Klein et al. | |
| 6,193,601 B1 | 2/2001 | Torczynski | |
| 6,222,729 B1 | 4/2001 | Yoshikawa | |
| 6,318,113 B1 | 11/2001 | Levy et al. | |
| 6,328,776 B1 | 12/2001 | Shanks et al. | |
| 6,402,613 B1 | 6/2002 | Teagle | |
| 6,411,515 B1 * | 6/2002 | Sakamoto et al. | ............ 361/704 |

(Continued)

FOREIGN PATENT DOCUMENTS

| | | |
|---|---|---|
| CN | 101173817 A | 5/2008 |
| CN | 101437385 A | 5/2009 |

(Continued)

OTHER PUBLICATIONS

Office Action, U.S. Appl. No. 12/851,992, Feb. 21, 2012, pp. 1-9.

(Continued)

*Primary Examiner* — Boris Chervinsky
(74) *Attorney, Agent, or Firm* — Edward J. Lenart; Katherine S. Brown; Biggers Kennedy Lenart Spraggins LLP

(57) ABSTRACT

A chassis for a plurality of computers for use in a data center, the chassis at least one extensible fin, the fin either extensible perpendicularly from the front of the chassis or extensible parallel with the front of the chassis.

16 Claims, 5 Drawing Sheets

(56) References Cited

U.S. PATENT DOCUMENTS

| | | | |
|---|---|---|---|
| 6,491,578 B2 | 12/2002 | Yoshinori et al. | |
| 6,526,702 B2 | 3/2003 | Jones | |
| 6,557,357 B2 | 5/2003 | Spinazzola et al. | |
| 6,574,104 B2 | 6/2003 | Patel et al. | |
| 6,574,970 B2 | 6/2003 | Spinazzola et al. | |
| 6,616,524 B2 | 9/2003 | Storck, Jr. et al. | |
| 6,648,752 B2 | 11/2003 | Vernier et al. | |
| 6,672,955 B2 | 1/2004 | Charron | |
| 6,694,759 B1 | 2/2004 | Bash et al. | |
| 6,747,872 B1 | 6/2004 | Patel et al. | |
| 6,772,604 B2 | 8/2004 | Bash et al. | |
| 6,775,997 B2 | 8/2004 | Bash et al. | |
| 6,813,897 B1 | 11/2004 | Bash et al. | |
| 6,819,563 B1 * | 11/2004 | Chu et al. | 361/696 |
| 6,826,456 B1 | 11/2004 | Irving et al. | |
| 6,832,489 B2 | 12/2004 | Bash et al. | |
| 6,832,490 B2 | 12/2004 | Bash et al. | |
| 6,834,512 B2 | 12/2004 | Bash et al. | |
| 6,854,284 B2 | 2/2005 | Bash et al. | |
| 6,862,179 B2 | 3/2005 | Beitelmal et al. | |
| 6,868,683 B2 | 3/2005 | Bash et al. | |
| 6,882,531 B2 | 4/2005 | Modica | |
| 6,945,058 B2 | 9/2005 | Bash et al. | |
| 6,957,544 B2 | 10/2005 | Dobbs et al. | |
| 7,033,267 B2 | 4/2006 | Rasmussen | |
| 7,050,300 B2 | 5/2006 | Hein | |
| 7,074,123 B2 | 7/2006 | Bettridge et al. | |
| 7,170,745 B2 | 1/2007 | Bash et al. | |
| 7,214,131 B2 | 5/2007 | Malone | |
| 7,226,353 B2 | 6/2007 | Bettridge et al. | |
| 7,251,547 B2 | 7/2007 | Bash et al. | |
| 7,259,963 B2 | 8/2007 | Germagian et al. | |
| 7,266,964 B2 | 9/2007 | Vogel et al. | |
| 7,347,058 B2 | 3/2008 | Malone et al. | |
| 7,361,081 B2 | 4/2008 | Beitelmal et al. | |
| 7,366,632 B2 | 4/2008 | Hamann et al. | |
| 7,379,298 B2 | 5/2008 | Walsh et al. | |
| 7,486,511 B1 | 2/2009 | Griffel et al. | |
| 7,518,863 B2 * | 4/2009 | Wayman et al. | 361/690 |
| 7,568,360 B1 | 8/2009 | Bash et al. | |
| 7,596,476 B2 | 9/2009 | Rasmussen et al. | |
| 7,643,291 B2 | 1/2010 | Mallia et al. | |
| 7,644,051 B1 | 1/2010 | Moore et al. | |
| 7,656,660 B2 | 2/2010 | Hoeft et al. | |
| 7,660,109 B2 * | 2/2010 | Iyengar et al. | 361/679.47 |
| 7,660,116 B2 * | 2/2010 | Claassen et al. | 361/696 |
| 7,726,144 B2 | 6/2010 | Larson et al. | |
| 7,739,073 B2 | 6/2010 | Hamann et al. | |
| 7,756,667 B2 | 7/2010 | Hamann et al. | |
| 7,862,410 B2 | 1/2011 | McMahan et al. | |
| 7,864,527 B1 * | 1/2011 | Whitted | 361/696 |
| 7,864,530 B1 | 1/2011 | Hamburgen et al. | |
| 7,869,210 B2 | 1/2011 | Moss | |
| 7,878,889 B2 | 2/2011 | Day | |
| 7,881,910 B2 | 2/2011 | Rasmussen et al. | |
| 7,885,795 B2 | 2/2011 | Rasmussen et al. | |
| 7,903,407 B2 | 3/2011 | Matsushima et al. | |
| 7,907,402 B2 | 3/2011 | Caveney | |
| 7,957,139 B2 | 6/2011 | Davis et al. | |
| 7,979,250 B2 | 7/2011 | Archibald et al. | |
| 7,986,526 B1 | 7/2011 | Howard et al. | |
| 7,991,592 B2 | 8/2011 | VanGilder et al. | |
| 8,009,430 B2 | 8/2011 | Claassen et al. | |
| 8,054,625 B2 | 11/2011 | Noteboom et al. | |
| 8,083,302 B2 * | 12/2011 | Thompson et al. | 312/296 |
| 8,090,476 B2 | 1/2012 | Dawson et al. | |
| 8,144,464 B2 * | 3/2012 | VanDerVeen et al. | 361/692 |
| 8,160,838 B2 | 4/2012 | Ramin et al. | |
| 8,164,897 B2 | 4/2012 | Graybill et al. | |
| 8,175,753 B2 | 5/2012 | Sawczak et al. | |
| 8,229,713 B2 | 7/2012 | Hamann et al. | |
| 8,244,502 B2 | 8/2012 | Hamann et al. | |
| 8,250,877 B2 * | 8/2012 | Correa et al. | 62/259.2 |
| 8,346,398 B2 | 1/2013 | Ahmed et al. | |
| 8,473,265 B2 | 6/2013 | Hlasny et al. | |
| 8,514,577 B2 * | 8/2013 | Chen | 361/727 |
| 8,553,411 B2 * | 10/2013 | Abraham et al. | 361/679.49 |
| 8,560,677 B2 | 10/2013 | VanGilder et al. | |
| 8,582,292 B1 * | 11/2013 | Eichelberg | 361/679.49 |
| 8,639,482 B2 | 1/2014 | Rasmussen et al. | |
| 8,672,732 B2 | 3/2014 | Rasmussen et al. | |
| 2003/0067745 A1 | 4/2003 | Patel et al. | |
| 2005/0159099 A1 | 7/2005 | Malone | |
| 2005/0192680 A1 | 9/2005 | Cascia et al. | |
| 2005/0237716 A1 | 10/2005 | Chu et al. | |
| 2005/0267639 A1 | 12/2005 | Sharma et al. | |
| 2006/0074609 A1 | 4/2006 | Freeman et al. | |
| 2006/0199508 A1 | 9/2006 | Nair et al. | |
| 2006/0260338 A1 | 11/2006 | VanGilder et al. | |
| 2007/0167125 A1 | 7/2007 | Rasmussen et al. | |
| 2007/0171610 A1 | 7/2007 | Lewis | |
| 2007/0173189 A1 | 7/2007 | Lewis | |
| 2008/0204999 A1 | 8/2008 | Clidaras et al. | |
| 2008/0269932 A1 | 10/2008 | Chardon et al. | |
| 2008/0285232 A1 | 11/2008 | Claassen et al. | |
| 2008/0288193 A1 | 11/2008 | Claassen et al. | |
| 2009/0012633 A1 | 1/2009 | Liu et al. | |
| 2009/0031896 A1 | 2/2009 | Abraham et al. | |
| 2009/0059523 A1 | 3/2009 | Mallia et al. | |
| 2009/0061755 A1 | 3/2009 | Calder et al. | |
| 2009/0107652 A1 | 4/2009 | VanGilder et al. | |
| 2009/0113323 A1 | 4/2009 | Zhao et al. | |
| 2009/0138313 A1 | 5/2009 | Morgan et al. | |
| 2009/0150123 A1 | 6/2009 | Archibald et al. | |
| 2009/0156114 A1 | 6/2009 | Ahladas et al. | |
| 2009/0168345 A1 | 7/2009 | Martini | |
| 2009/0173017 A1 | 7/2009 | Hall | |
| 2009/0259343 A1 | 10/2009 | Rasmussen et al. | |
| 2009/0277605 A1 | 11/2009 | VanGilder et al. | |
| 2009/0305625 A1 | 12/2009 | Dawson et al. | |
| 2009/0326879 A1 | 12/2009 | Hamann et al. | |
| 2009/0326884 A1 | 12/2009 | Amemiya et al. | |
| 2010/0027216 A1 | 2/2010 | Matsushima et al. | |
| 2010/0030528 A1 | 2/2010 | Smith et al. | |
| 2010/0035535 A1 | 2/2010 | Taylor | |
| 2010/0041327 A1 | 2/2010 | Desler | |
| 2010/0064610 A1 | 3/2010 | Kulkarni et al. | |
| 2010/0067745 A1 | 3/2010 | Kovtun et al. | |
| 2010/0126696 A1 | 5/2010 | Novotny et al. | |
| 2010/0151781 A1 | 6/2010 | Slessman et al. | |
| 2010/0263830 A1 | 10/2010 | Noteboom et al. | |
| 2011/0189936 A1 | 8/2011 | Haspers et al. | |
| 2011/0205705 A1 | 8/2011 | Graybill et al. | |
| 2011/0246147 A1 | 10/2011 | Rasmussen et al. | |
| 2011/0288664 A1 | 11/2011 | Archibald et al. | |
| 2012/0020009 A1 | 1/2012 | Archibald et al. | |
| 2012/0033368 A1 | 2/2012 | Archibald et al. | |
| 2012/0035781 A1 | 2/2012 | Archibald et al. | |
| 2012/0054527 A1 | 3/2012 | Pfeifer et al. | |
| 2012/0071992 A1 | 3/2012 | VanGilder et al. | |
| 2012/0072195 A1 | 3/2012 | Archibald et al. | |
| 2012/0109404 A1 | 5/2012 | Pandey et al. | |
| 2012/0243173 A1 | 9/2012 | Archibald et al. | |
| 2013/0166258 A1 | 6/2013 | Hamann et al. | |
| 2013/0178144 A1 | 7/2013 | Archibald et al. | |
| 2013/0200764 A1 | 8/2013 | Archibald et al. | |

FOREIGN PATENT DOCUMENTS

| | | |
|---|---|---|
| CN | 100533343 C | 8/2009 |
| CN | 201319718 Y | 9/2009 |

OTHER PUBLICATIONS

Notice of Allowance, U.S. Appl. No. 12/851,992, May 9, 2012, pp. 1-7.

IBM, "Automatic Opening Floor Tile for Back-up Air Cooling of Server Racks", IP.Com Prior Art Database, Jul. 18, 2005, pp. 1-5, IP.com No. IPCOM000126445D, IP.com.

IBM, "Dynamic Thermal Mapping and Trend Analysis as a Control Mechanism for HVAC Systems in Data Centers," IP.Com Prior Art Database, Mar. 27, 2006, pp. 1-3, IP.com No. IPCOM000135036D, IP.com.

(56) References Cited

OTHER PUBLICATIONS

Disclosed Anonymously, "Method for a Managed Airflow Server Cabinet", IP.Com Prior Art Database, Apr. 26, 2006, pp. 1-7, IP.com No. IPCOM000135845D, IP.com.

IBM, "Apparatus and Method for Measuring Volumetric Airflow Rates for a BlueGene Rack or Rack Assembly with Vertical Airflow", IP.Com Prior Art Database, Jun. 18, 2008, pp. 1-9, IP.com No. IPCOM000171776D, IP.com.

IBM, "The Cooling Control System of Server", IP.Com Prior Art Database, Dec. 29, 2009, pp. 1-4, IP.com No. IPCOM000191308D, IP.com.

El-Hakim, S.F., et al., "Sensor Based Creation of Indoor Virtual Environment Models", Proceedings of the 1997 International Conference on Virtual Systems and MultiMedia, VSMM '97, Sep. 10-12, 1997, pp. 50-58, IEEE Computer Society, Washington, DC, USA. DOI: 10.1109/VSMM.1997.622327.

Office Action, U.S. Appl. No. 12/840,863, Jan. 26, 2012, pp. 1-11.

Notice of Allowance, U.S. Appl. No. 12/840,863, Mar. 22, 2012, pp. 1-7.

Office Action, U.S. Appl. No. 12/781,915, Apr. 26, 2013, pp. 1-13.

Final Office Action, U.S. Appl. No. 12/781,915, Oct. 24, 2013, pp. 1-10.

Final Office Action, U.S. Appl. No. 12/852,091, Apr. 23, 2013, pp. 1-11.

Notice of Allowance, U.S. Appl. No. 12/852,091, Aug. 21, 2013, pp. 1-13.

Office Action, U.S. Appl. No. 12/852,091, Nov. 26, 2012, pp. 1-11.

Final Office Action, U.S. Appl. No. 12/885,456, Sep. 10, 2013, pp. 1-9.

Office Action, U.S. Appl. No. 12/885,456, Mar. 19, 2013, pp. 1-20.

Kim et al., "Indoor Spatial Analysis Using Space Syntax", The International Archives of the Photogrammetry, Remote Sensing and Spatial Information Sciences, vol. XXXVII, Part B2, Jul. 2008, pp. 1065-1070, International Society for Photogrammetry and Remote Sensing (ISPRS), The Netherlands.

Papakonstantinou et al., "Air quality in an underground garage: computational and experimental investigation of ventilation effectiveness", Energy and Buildings, vol. 35, Issue 9, Oct. 2003, pp. 933-940, ScienceDirect.com (online publication), Elsevier B.V., Amsterdam.

Notice of Allowance, U.S. Appl. No. 12/885,456, Apr. 7, 2014, pp. 1-15.

* cited by examiner

HOT OR COLD AISLE COMPUTER CHASSIS

CROSS-REFERENCE TO RELATED APPLICATION

This application is a continuation application of and claims priority from U.S. patent application Ser. No. 12/851,992, filed on Aug. 6, 2010.

BACKGROUND OF THE INVENTION

1. Field of the Invention

The field of the invention is chassis for computers in data centers and data center organization.

2. Description Of Related Art

Typical data centers have floor tiles that are perforated. Air conditioning systems below the floor blow cooled air through the perforated floor tiles to cool the computers of the data centers. Conventional chassis include fans in the chassis that blow the cooled air over the computers in the chassis

SUMMARY OF THE INVENTION

A chassis for a plurality of computers for use in a data center, the chassis including at least one extensible fin, the fin either being extensible perpendicularly from the front of the chassis or being extensible parallel with the front of the chassis.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
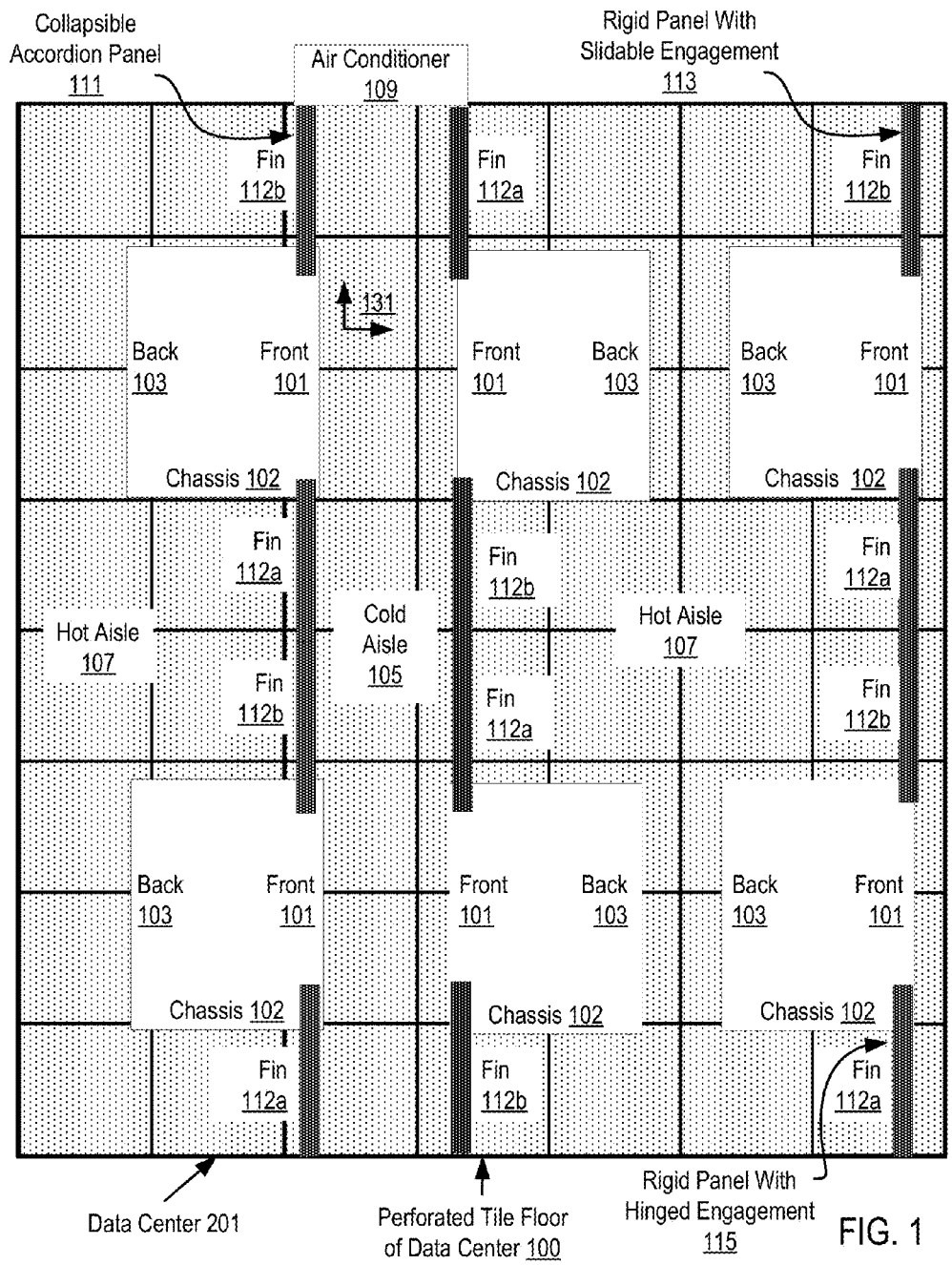
FIG. 1 sets forth a block diagram of an aerial view of a data center organized according to embodiments of the present invention and including a plurality of chassis each including a plurality of computers for use in the data center.

Exemplary chassis for use in data centers and methods for organizing data centers in accordance with the present invention are described with reference to the accompanying drawings, beginning with FIG. 1. FIG. 1 sets forth a block diagram of an aerial view of a data center (201) organized according to embodiments of the present invention and including a plurality of chassis (102) each including a plurality of computers for use in the data center. A data center is a facility used to house computer systems and associated components, such as telecommunications and storage systems. Data centers typically also include redundant or backup power supplies, redundant data communications connections, and environmental controls such as air conditioning, fire suppression, and security devices.

The data center (201) of FIG. 1 has a perforated tile floor (100) and an air conditioning system (109) to blow cooled air beneath the perforated tile floor. Cooled air is blown from beneath the perforated tile floor of data center to cool the computers contained in the chassis (102) of the data center.

The data center (201) of FIG. 1 includes a number of chassis (102) each containing a plurality of computers for use in a data center (201). Each chassis (201) of the data center (201) includes at least one extensible fin (112a and 112b). In the example of FIG. 1 each chassis has two fins (112a and 112b) extensible from each side of the chassis and the fins are extensible perpendicularly (131) from the front (101) of the chassis (102). The extensible fins are typically the height of the chassis or tall enough to usefully create aisles between the chassis of the data center. Extensible fins for chassis according to embodiments of the present invention may be integrated in the chassis when the chassis is build or added on after the chassis is built or integrated with the chassis in any other way that will occur to those of skill in the art. Extensible fins for chassis according to embodiments of the present invention may be implemented as collapsible accordion panels (111), rigid panels with a slidable engagements (113) with the chassis, rigid panels with hinged engagements (115), or any other type of fins and engagement that will occur to those of skill in the art.

Each chassis (102) of the data center (201) of FIG. 1 has a front (101) and a back (103). The chassis of FIG. 1 are arranged in rows with the front (101) of each chassis in each row facing the front (101) of each chassis (102) in a next row and the back (103) of each chassis in a row facing the back (103) of each chassis in a next row. Each fin (112a and 112b) of each chassis of FIG. 1 has at least one connector to connect the fin to either another chassis or to connect the fin to the fin of another chassis. In this way, aisles are formed between the rows of chassis.

The chassis (102) of the data center also contain fans to blow air from the front of the chassis across the computers of the chassis to the back of the chassis. The extensible fins of the chassis of the data center of FIG. 1 therefore create a cold aisle (105) between the rows of chassis whose fronts (101) face one anther and a hot aisle (107) between the rows of chassis whose backs (103) face one another. In alternative embodiments, fans may blow air in the other direction over the computers of the chassis thereby reversing the hot and cold aisles.

After blowing across the chassis hot air may be captured from the hot aisle then cooled. The recaptured air may then be returned to a cold aisle increasing efficiency and regulating air flow.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
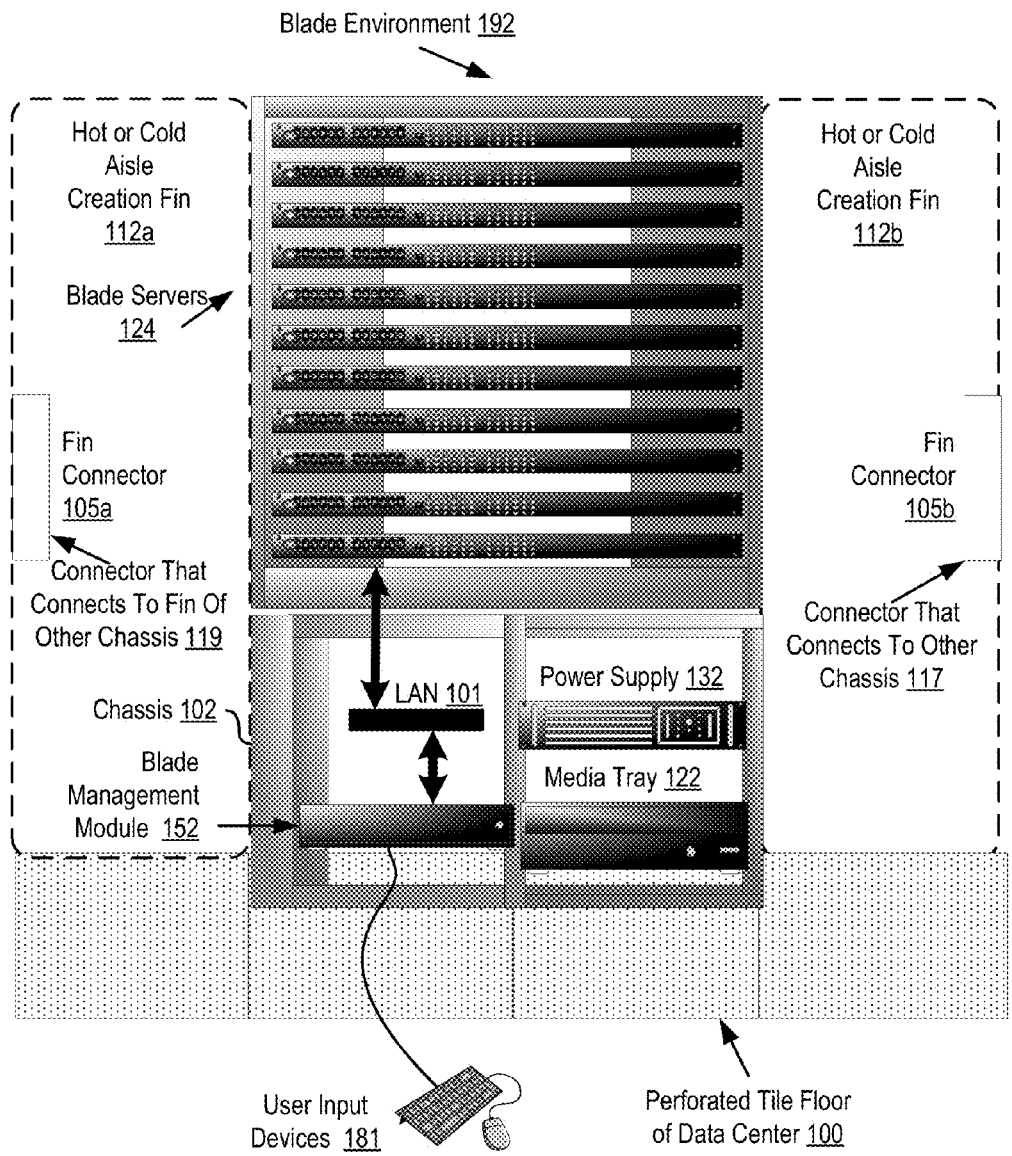
FIG. 2 sets forth a diagram of a blade environment having a chassis according to embodiments of the present invention.

For further explanation, FIG. 2 sets forth a diagram of a blade environment having a chassis according to embodiments of the present invention. The example of FIG. 2 includes a blade environment (192). 'Blade environment,' as the term is used in this specification, refers generally to a blade server system installed in this example in a two-bay chassis (102) and including a number of blade servers (124), one or more blade management modules (152), a media tray (122), and a blade server system power supply (132).

The blade management module (152) is a small computer in its own right, including software and hardware components, one or more computer processors and computer memory, that provides system management functions for all components in the example blade environment (192) including the blade servers (124) and the media tray (122). The blade management module of FIG. 2 also makes available connections for user input devices such as mice or keyboards (181) that are not generally connected directly to the blade servers or to the blade environment chassis. The blade servers themselves (124), installed in a cabinet bay (126) of the exemplary blade environment (192) in the example of FIG. 2, are several computing devices implemented in blade form factor. The blade servers share access to the media tray (122). The blade servers (124) are connected to one another and to the blade management module (152) for data communications through a local area network ('LAN') (101). The LAN (101) is a small network installed within the chassis of the blade environment.

The media tray (122) houses non-volatile memory media generally. A media tray may typically include Compact Disc read-only media drives ('CD-ROM'), Digital Video Disc ROM drives (DVD-ROM), CD-RW drives, DVD-RW drives, floppy disk drives, and so on as will occur those of skill in the art.

The chassis (102) of the blade environment of FIG. 2 includes two hot or cold aisle creation fins (112a and 112b) which are extensible perpendicularly from the front of the chassis. The hot or cold aisle creation fins (112a and 112b) in FIG. 2 are implemented as rigid panels that are slidably engaged with the chassis. That is, the fins (112a and 112b) slide out perpendicularly with respect to the front of the chassis. Each fin (112a and 112b) has a fin connector (105a and 105b) which may be used to connect the fin to either the fin of another chassis (119) or to another chassis itself (117). Such connectors may be implemented as latches, fasteners, hook fasters and others as will occur to those of skill in the art. With the fins extended between a number of chassis according to the example of FIG. 1 a hot or cold aisle may be created on the perforated tile floor (100) of a data center.

The arrangement of the blade environment (192), network (101), and other devices making up the exemplary system illustrated in FIG. 2 are for explanation, not for limitation. Data processing systems useful according to various embodiments of the present invention may include additional servers, routers, and other devices, not shown in FIG. 2, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 2.

In the example of FIGS. 1 and 2, the chassis included fins that were extensible perpendicularly with respect to the front of the chassis. In alternative embodiments, chassis according to embodiments of the present invention may include fins that are extensible in a manner parallel with the front of the chassis. For further explanation, FIG. 3 sets forth a block diagram of an aerial view of a data center (201) organized according to some embodiments of the present invention and including a plurality of chassis (102) each including a plurality of computers for use in the data center. The data center (201) of FIG. 3, like the data center of FIGS. 1 and 2, has a perforated tile floor (100) beneath which is installed an air conditioning system. Cooled air is blown from beneath the perforated tile floor of data center to cool the computers contained in the chassis (102) of the data center.

Figure 3:
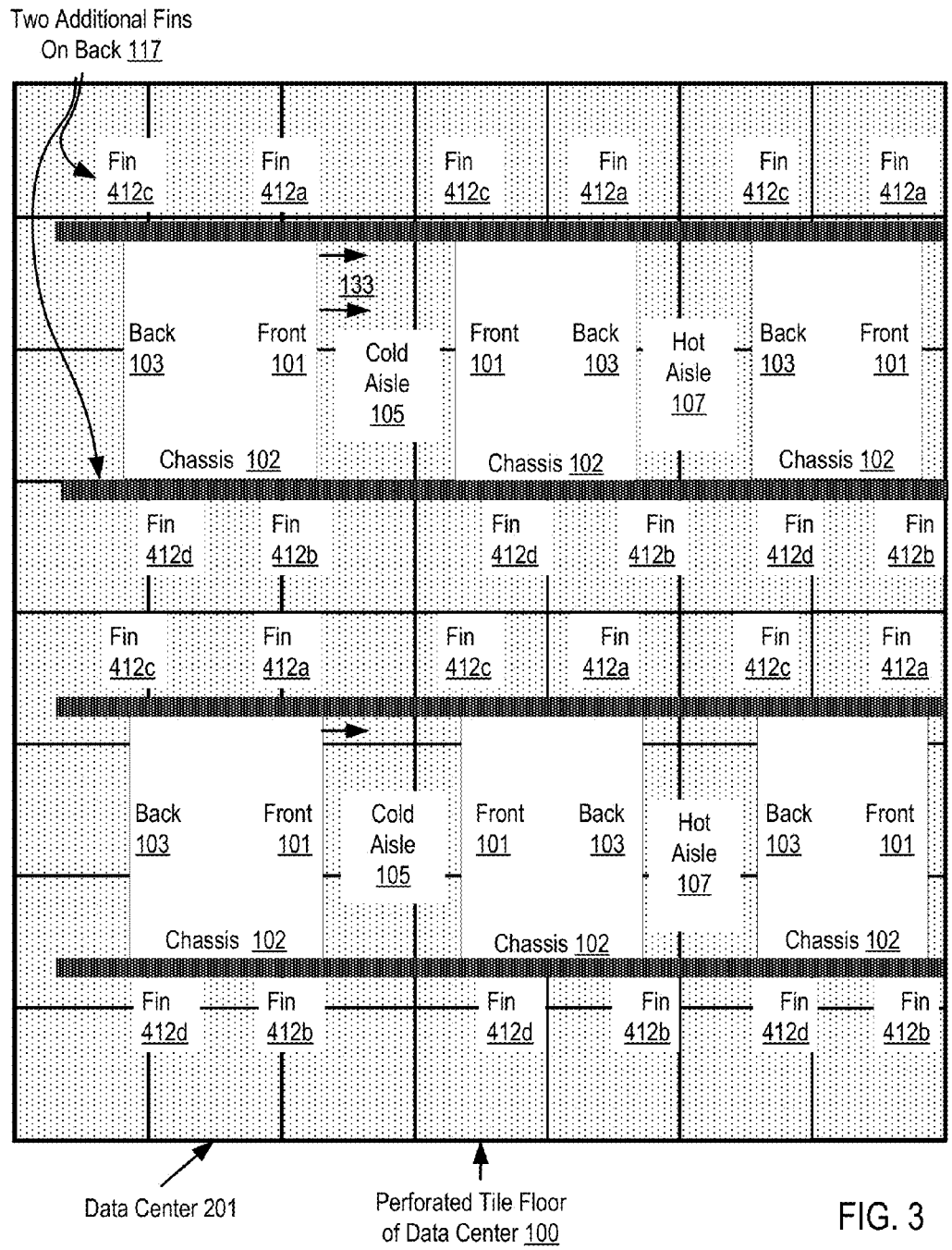
FIG. 3 sets forth a block diagram of an aerial view of a data center organized according to some embodiments of the present invention and including a plurality of chassis each including a plurality of computers for use in the data center.

The data center (201) of FIG. 3 includes a number of chassis (102) each containing a plurality of computers for use in a data center (201). Each chassis (102) of FIG. 3 includes two extensible fins (412a and 412b) that are extensible in a manner that is parallel (133) with the front (101) of the chassis (102). Each chassis (102) of FIG. 3 also includes two extensible fins (412c and 412d) (117) that are extensible in a manner that is parallel with the back (103) of the chassis (102). Extensible fins for chassis according to embodiments of the present invention may be integrated in the chassis when the chassis is build or added on after the chassis is built or installed in the data center or integrated with the chassis in other ways as will occur to those of skill in the art. Extensible fins for chassis according to embodiments of the present invention may be implemented as collapsible accordion panels, rigid panels with a slidable engagements with the chassis, rigid panels with hinged engagements, or any other type of fins or engagement that will occur to those of skill in the art.

Each chassis (102) of the data center (201) of FIG. 3 has a front (101) and a back (103). The chassis of FIG. 3 are arranged in rows such that at least two chassis (102) of a row have fronts (101) that face one another and have backs (103) that face one another. Each fin (112a and 112b) of each chassis of FIG. 1 has connector to connect the fin (412c and 412d) of another chassis. Such connectors may be implemented as latches, fasteners, hook fasters and others as will occur to those of skill in the art. In alternative embodiments, the fins of the chassis may connect directly to another chassis rather than to the fins of another chassis.

The chassis (102) of the data center also contain fans to blow air from the front of the chassis across the computers of the chassis to the back of the chassis. In each row of the example of FIG. 3, the extensible fins therefore create a cold aisle (105) between the chassis whose fronts (101) face one anther and a hot aisle (107) between the chassis whose backs (103) face one another. In alternative embodiments, fans may blow air in the other direction over the computers of the chassis thereby reversing the hot and cold aisles.

After blowing across the chassis hot air may be captured from the hot aisle then cooled. The recaptured air may then be returned to a cold aisle increasing efficiency and regulating air flow.

In the example of FIG. 3, the fins on each of the two rows of chassis are engaged to create two sets of hot and cold aisles. In alternative embodiments, the two rows of chassis may be placed side to side such that the chassis are next to one another. In such embodiments, extending the outside fins of each chassis creates a single and larger hot aisle and a single and larger cold aisle instead of two hot and cold aisles.

The arrangement of servers and other devices making up the exemplary system illustrated in FIG. 3 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 3.

Figure 4:
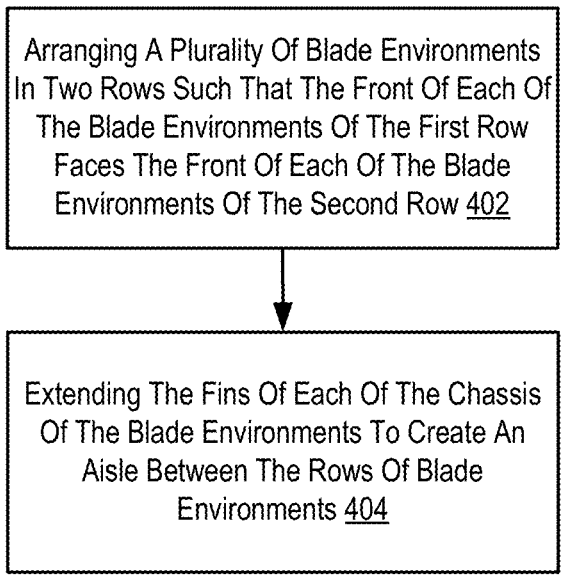
FIG. 4 sets forth a flow chart illustrating an exemplary method for organizing a data center.

For further explanation, FIG. 4 sets forth a flow chart illustrating an exemplary method for organizing a data center. The data center of the example of FIG. 4 includes a plurality of blade environments, each blade environment including a chassis having at least one extensible fin which is extensible perpendicularly with respect to the front of the chassis. The data center also includes a perforated tile floor and an air conditioning system below the floor and air conditioning system blows cooled air through the perforated tile floor.

The method of FIG. 4 includes arranging (402) a plurality of blade environments in two rows such that the front of each of the blade environments of the first row faces the front of each of the blade environments of the second row. Arranging (402) a plurality of blade environments in two rows such that the front of each of the blade environments of the first row faces the front of each of the blade environments of the second row results in an organization of blade environments similar to the example of FIG. 1.

The method of FIG. 4 also includes extending (404) the fins of each of the chassis of the blade environments to create an aisle between the rows of blade environments. Extending (404) the fins of each of the chassis of the blade environments to create an aisle between the rows of blade environments may be carried out by connecting the fin of at least one of blade environment to the fin of at least one other blade environment. Extending (404) the fins of each of the chassis of the blade environments to create an aisle between the rows of blade environments may also be carried out by connecting the fin of at least one of the blade environments to the chassis of at least one other blade environment.

Figure 5:
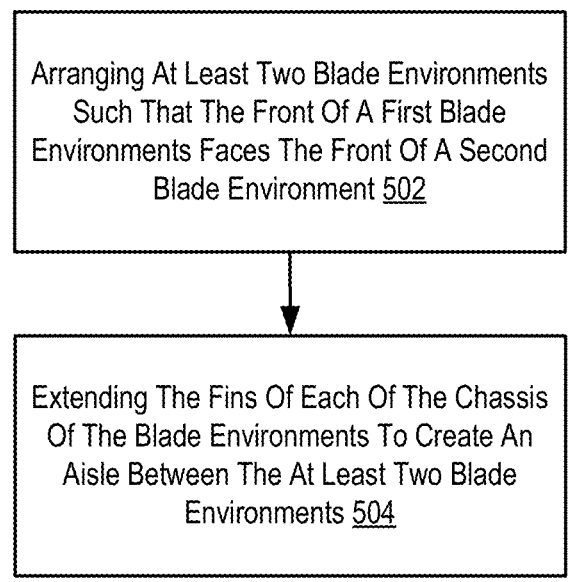
FIG. 5 sets forth a flow chart illustrating an exemplary method for organizing a data center.

For further explanation, FIG. 5 sets forth a flow chart illustrating an exemplary method for organizing a data center. The data center of the example of FIG. 5 includes a plurality of blade environments, each blade environment including a chassis having at least one extensible fin which is extensible parallel with respect to the front of the chassis. The data center also includes a perforated tile floor and an air conditioning system below the floor and air conditioning system blows cooled air through the perforated tile floor.

The method of FIG. 5 includes arranging (502) at least two blade environments such that the front of a first blade environments faces the front of a second blade environment. Arranging (502) at least two blade environments such that the front of a first blade environments faces the front of a second blade environment results an organization of blade environments similar to the example of FIG. 3.

The method of FIG. 5 also includes extending (504) the fins of each of the chassis of the blade environments to create an aisle between the at least two blade environments. Extending (504) the fins of each of the chassis of the blade environments to create an aisle between the rows of blade environments may be carried out by connecting the fin of at least the first blade environment to the fin of at least the second blade environment. Extending (504) the fins of each of the chassis of the blade environments to create an aisle between the rows of blade environments may also be carried out by connecting the fin of at least the first blade environment to the chassis of at least the second blade environment.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A chassis for a plurality of computers for use in a data center, the chassis comprising:
    at least one extensible fin, the fin being extensible perpendicularly from the front of the chassis.
2. The chassis of claim 1 wherein the fin is a collapsible accordion panel.
3. The chassis of claim 1 wherein the fin is a rigid panel with a slidable engagement with the chassis.
4. The chassis of claim 1 wherein the fin is a rigid panel with a hinged engagement with the chassis.
5. The chassis of claim 1 wherein the fin includes a connector to connect the fin to another chassis.
6. The chassis of claim 1 wherein the fin includes a connector to connect the fin to the fin of another chassis.
7. The chassis of claim 1 further comprising two fins extensible from each side of the chassis.
8. The chassis of claim 1 wherein the chassis is a chassis of a blade environment containing a plurality of blade servers.
9. A chassis for a plurality of computers for use in a data center, the chassis comprising:
    at least one extensible fin, the fin being extensible parallel with the front of the chassis.
10. The chassis of claim 9 wherein the fin is a collapsible accordion panel.
11. The chassis of claim 9 wherein the fin is a rigid panel with a slidable engagement with the chassis.
12. The chassis of claim 9 wherein the fin is a rigid panel with a hinged engagement with the chassis.
13. The chassis of claim 9 wherein the fin includes a connector to connect the fin to another chassis.
14. The chassis of claim 9 wherein the fin includes a connector to connect the fin to the fin of another chassis.
15. The chassis of claim 9 further comprising two fins extensible from each side of the front of chassis.
16. The chassis of claim 15 including two additional fins on each side of the back of the chassis and extensible parallel to the back of the chassis.

* * * * *